(12) United States Patent  (10) Patent No.: US 9,237,631 B2
Chen et al.  (45) Date of Patent: Jan. 12, 2016

(54) LIGHT EMITTING CHIP AND LIGHT EMITTING DEVICE HAVING THE SAME

(71) Applicant: Lextar Electronics Corporation, Hsinchu (TW)

(72) Inventors: Yu-Sheng Chen, Chiayi (TW); Cheng-Chun Liao, Hsinchu (TW); Chia-Yen Lee, Tainan (TW); Yu-Min Lin, New Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 268 days.

(21) Appl. No.: 13/941,575

(22) Filed: Jul. 15, 2013

(65) Prior Publication Data

US 2014/0021877 A1  Jan. 23, 2014

(30) Foreign Application Priority Data

Jul. 18, 2012  (TW) .............................. 101125876 A

(51) Int. Cl.
H05B 37/00 (2006.01)
H05B 39/00 (2006.01)
H05B 37/02 (2006.01)
H05B 33/08 (2006.01)

(52) U.S. Cl.
CPC ............ *H05B 37/02* (2013.01); *H05B 33/0824* (2013.01); *H01L 2224/48137* (2013.01)

(58) Field of Classification Search
CPC ............................ H05B 37/02; H05B 33/0824
USPC .................... 315/185 R, 200 R; 257/E33.066
See application file for complete search history.

(56) References Cited

U.S. PATENT DOCUMENTS

| 7,375,381 | B2 | 5/2008 | Shimizu et al. |
| 7,714,500 | B2 * | 5/2010 | Hirakata et al. ............... 313/504 |
| 7,999,463 | B2 * | 8/2011 | Nomura ........................ 313/506 |
| 8,192,051 | B2 * | 6/2012 | Dau et al. ................. 362/249.02 |
| 8,598,619 | B2 * | 12/2013 | Kim et al. ...................... 257/103 |
| 8,704,265 | B2 * | 4/2014 | Seo et al. ......................... 257/99 |
| 8,792,068 | B2 * | 7/2014 | Shiratori et al. ................ 349/61 |
| 8,876,334 | B2 * | 11/2014 | Chung et al. .................. 362/294 |
| 9,006,759 | B2 * | 4/2015 | Miyashita et al. .............. 257/91 |
| 2009/0262527 | A1 | 10/2009 | Chou |
| 2010/0213474 | A1 * | 8/2010 | Hsu et al. ........................ 257/89 |

FOREIGN PATENT DOCUMENTS

| TW | 567619 | 12/2003 |
| TW | M349042 | 1/2009 |
| TW | 200945570 | 11/2009 |
| TW | 201021624 A | 6/2010 |
| TW | M404311 | 5/2011 |

OTHER PUBLICATIONS

English Abstract translation of TWM404311 (Published May 21, 2011).
English Abstract translation of TW200945570 (Published Nov. 1, 2009).
TW Office Action dated Jul. 15, 2014.
English Abstract translation of TWM349042 (Published Jan. 11, 2009).

* cited by examiner

*Primary Examiner* — Kenneth B Wells
(74) *Attorney, Agent, or Firm* — McClure, Qualey & Rodack, LLP

(57) ABSTRACT

A light emitting chip operating under a DC power supply is provided. The light emitting chip includes a substrate and a plurality of light emitting elements. The light emitting elements are arranged on the substrate, and have the same or different area sizes. The light emitting elements are driven by a single driving voltage or sectionally driven by a plurality of driving voltages.

11 Claims, 14 Drawing Sheets

LIGHT EMITTING CHIP AND LIGHT EMITTING DEVICE HAVING THE SAME

This application claims the benefit of Taiwan application Serial No. 101125876, filed Jul. 18, 2012, the subject matter of which is incorporated herein by reference.

BACKGROUND OF THE INVENTION

1. Field of the Invention

The invention relates in general to a light emitting chip and a light emitting device having the same, and more particularly to a light emitting chip operating under a DC power supply and a light emitting device having the same.

2. Description of the Related Art

Applications of light emitting chips are prevalent in the daily life. As having features of being small in size, low in power consumption, low in temperature and long in life cycle, light emitting chips have gradually replaced conventional incandescent light bulbs having similar functions. In general, a light emitting chip is provided with a conductive terminal extended as a power contact. With electrical conduction of the conductive terminal, the light emitting chip generates a light source to offer light emitting effects.

As the market demand of light emitting chips continues to grow, light emitting chips are applied in diversified products. Therefore, it is a goal to develop a light emitting chip that more satisfies user needs and has enhanced light emitting efficiency.

SUMMARY OF THE INVENTION

The invention is directed to a light emitting chip and a light emitting device having the same. The light emitting chip operates under a DC power supply, and includes multiple light emitting elements that can be driven by a single driving voltage or sectionally driven by multiple driving voltages.

According to a first aspect of the present invention, a light emitting chip is provided. The light emitting chip operates under a DC power supply, and includes a substrate and multiple light emitting elements. The light emitting elements are arranged on the substrate, and have the same area size or different area sizes. The light emitting elements can be driven by a single driving voltage or sectionally driven by multiple driving voltages.

According to a second aspect of the present invention, a light emitting device is provided. The light emitting device includes the foregoing light emitting chip and a power supply circuit. The light emitting chip further includes a first external electrical contact disposed on a light emitting element and multiple second external electrical contacts correspondingly disposed on a part of the light emitting elements, respectively. The first external electrical contact and the second external electrical contacts are for coupling the power supply circuit, and receive driving voltages outputted by the power supply circuit for sectionally driving the light emitting elements. The first external electrical contact is a positive contact, and the second external electrical contacts are negative contacts. The power supply circuit is coupled to the first and second external electrical contacts of the light emitting chip. The power supply circuit includes an AC power supply, a light modulator, and a multi-output linear power driver. The light modulator, coupled to the AC power supply, modulates a phase of an AC power inputted by the AC power supply and outputs a phase-modulated AC power. The multi-output linear power driver, coupled to the light modulator and the first and second external electrical contacts, transforms the phase-modulated AC power to a DC power, and outputs multiple DC driving voltages to the first and second external electrical contacts.

According to a third aspect of the present invention, a light emitting device is provided. The light emitting device includes the foregoing light emitting chip and a power supply circuit. Each light emitting region of the light emitting chip is disposed with a second external electrical contact. A first external electrical contact is a positive contact, and the second external electrical contacts are negative contacts. The power supply circuit is coupled to the first and second external electrical contacts of the light emitting chip. The power supply circuit includes an AC power supply, a light modulator, and a multi-output linear power driver. The light modulator, coupled to the AC power supply, modulates a phase of an AC power inputted by the AC power supply and outputs a phase-modulated AC power. The multi-output linear power driver, coupled to the light modulator and the first and second external electrical contacts, transforms the phase-modulated AC power to a DC power, and outputs a plurality of DC driving voltages to the first and second external electrical contacts.

According to a fourth aspect of the present invention, a light emitting device is provided. The light emitting device includes the foregoing light emitting chip and a power supply circuit. The light emitting elements form a plurality of light emitting regions, each having an average light emitting element area. The light emitting chip further includes a plurality of first external electrical contacts and a plurality of second external electrical contacts respectively disposed on several among the light emitting elements. The first and second external electrical contacts are for coupling a power supply circuit, and receive driving voltages outputted by the power supply circuit for sectionally driving the light emitting elements. The first external electrical contacts are positive contacts, and the second external electrical contacts are negative contacts. The power supply circuit, coupled to the first and second external electrical contacts, includes an AC power supply, a light modulator and a multi-output linear power driver. The light modulator, coupled to the AC power supply, modulates a phase of an AC power inputted by the AC power supply and outputs a phase-modulated AC power. The multi-output linear power driver, coupled to the light modulator and the first and second external electrical contacts, transforms the phase-modulated AC power to a DC power, and outputs a plurality of DC driving voltages to the first and second external electrical contacts.

According to a fifth aspect of the present invention, a light emitting device is provided. The light emitting device includes the foregoing light emitting chip and a power supply circuit. The light emitting elements form a plurality of light emitting regions, each having an average light emitting element area. The light emitting chip further includes a plurality of first external electrical contacts and a plurality of second external electrical contacts respectively disposed on several of the light emitting elements. The first and second external electrical contacts are for coupling a power supply circuit, and receive the driving voltages outputted by the power supply circuit for sectionally driving the light emitting elements. Each of the first external electrical contacts and each of the second external electrical contacts are respectively disposed in each of the light emitting regions. The first external electrical contacts are positive contacts, and the second external electrical contacts are negative contacts. The power supply circuit, coupled to the first and second external electrical contacts, includes an AC power supply, a light modulator and a multi-output linear power driver. The light modulator, coupled to the AC power supply, modulates a phase of an AC power inputted by the AC power supply and outputs a phase-modulated AC power. The multi-output linear power driver, coupled to the light modulator and the first and second external electrical contacts, transforms the phase-modulated AC power to a DC power, and outputs a plurality of DC driving voltages to the first and second external electrical contacts.

The above and other aspects of the invention will become better understood with regard to the following detailed description of the preferred but non-limiting embodiments. The following description is made with reference to the accompanying drawings.

DETAILED DESCRIPTION OF THE INVENTION

First Embodiment

Figure 1:
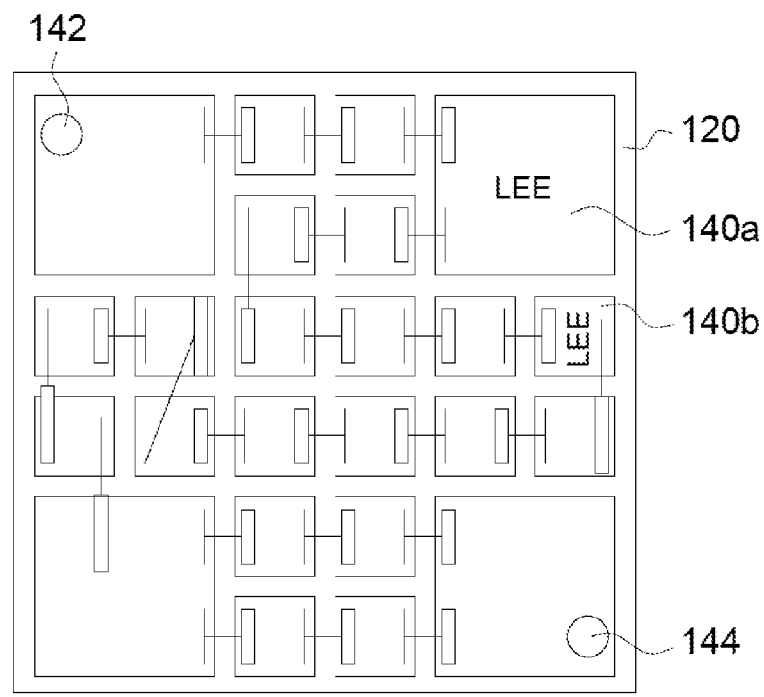
FIG. 1 is a schematic diagram of a light emitting chip according to an embodiment of the present invention.

FIG. 1 shows a schematic diagram of a light emitting chip according to a first embodiment of the present invention. Referring to FIG. 1, a light emitting chip 100 includes a substrate 120, a plurality of light emitting elements 140a and a plurality of light emitting elements 140b arranged on the substrate 120. The light emitting elements 140a and 140b operate under a DC power supply, and are light emitting diodes, for example. In FIG. 1, the size of the light emitting elements 140a is different from the size of the light emitting elements 140b. For example, the area size of a largest light emitting element (e.g., the light emitting element 140a) is substantially greater than 1.2 times the area size of a smallest light emitting element (e.g., the light emitting element 140b), and a total area of all the light emitting elements 140a and 140b is not greater than the area of the light emitting chip 100. It should be noted that the proportions in FIG. 1 are for exemplification purposes and are not to be construed as limitations to the present invention. In an embodiment, for example, the area of the light emitting element 140a is 10000 times of the area of the light emitting element 140b. In another embodiment, the area sizes of the light emitting element 140a and the light emitting element 140b may be substantially the same. Considering error factors such as process tolerances, an error within a tolerable range is allowed when calculating the area proportions.

The light emitting elements 140a and 140b are electrically connected to one another, and include a first external electrical contact 142 and a second external electrical contact 144 respectively disposed on two of the light emitting elements 140a and 140b. In FIG. 1, the first external electrical contact 142 and the second external electrical contact 144 are respectively disposed on the light emitting element 140a at the first row and first column and on the light emitting element 140a at the last row and last column. The first external electrical contact 142 and the second external electrical contact 144 are for coupling a power supply circuit 10 (shown in FIG. 13A), and receive a single voltage outputted by the power supply circuit 10 for driving the light emitting elements 140a and 140b.

In this embodiment, the light emitting chip 100 includes only one first external electrical contact 142 and one second external electrical contact 144. Thus, the light emitting element 100 is driven by the single driving voltage. In an alternative embodiment, the light emitting chip 100 may also include a plurality of first external electrical contacts 142 and/or a plurality of second external electrical contacts 144, so as to receive a plurality of driving voltages and be sectionally driven by the driving voltages.

Figure 2A:
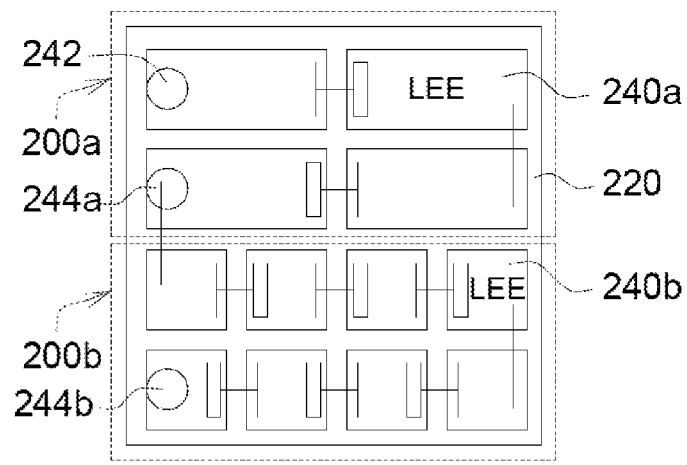
FIG. 2A is a schematic diagram of a light emitting chip according to an embodiment of the present invention.
Figure 2B:
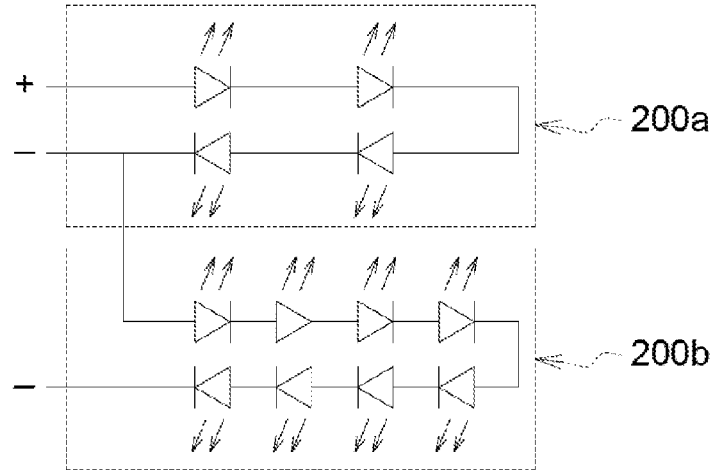
FIG. 2B is a circuit diagram of the light emitting chip in FIG. 2A.

FIGS. 2A and 2B are schematic diagrams of a light emitting chip according to an embodiment of the present invention. Referring to FIG. 2A, a light emitting chip 200 includes a substrate 220, and a light emitting element group 200a and a light emitting element group 200b arranged on the substrate 220. The light emitting element group 200a includes a plurality of light emitting elements 240a, and the light emitting group 200b includes a plurality of light emitting elements 240b. The light emitting elements 240a and 240b (e.g., light emitting diodes) operate under a DC power supply.

In this embodiment, the area size of the light emitting elements 240a is different from the area size of the light emitting elements 240b. For example, the area size of a largest light emitting element (e.g., the light emitting element 240a) is substantially greater than 1.2 times the area size of a smallest light emitting element (e.g., the light emitting element 240b), and a total area of all the light emitting elements 240a and 240b is not greater than the area of the light emitting chip 200. It should be noted that the proportions in FIG. 2A are for exemplification purposes and are not to be construed as limitations to the present invention. In an embodiment, for example, the area of the light emitting element 240a is 10000 times the area of the light emitting element 240b. Considering error factors such as process tolerances, an error within a tolerable range is allowed when calculating the area proportions.

The light emitting elements form a plurality of light emitting regions each having a respective average light emitting element area. In an embodiment, the area of each light emitting element within each light emitting region and the average light emitting area of the light emitting region formed by the light emitting elements have a difference of within 10%.

Taking FIG. 2A for example, the light emitting chip 200 has two light emitting regions—the light emitting region of the light emitting element group 200a and the light emitting region of the light emitting element group 200b. The light emitting region of the light emitting element group 200a is formed by four light emitting elements 240a; the light emitting region of the light emitting element group 200b is formed by eight light emitting elements 240b. Thus, by dividing the light emitting region of the light emitting element group 200a by the number (i.e., four) of the light emitting elements, an average light emitting element area can be obtained. Similarly, by dividing the light emitting region of the light emitting element group 200b by the number (i.e., eight) of the light emitting elements, another average light emitting element area can also be obtained.

In the light emitting region of the light emitting element group 200a, each of the light emitting elements 240a has a light emitting element area A1, and the light emitting elements 240a in the light emitting element group 200a may not be identical. The light emitting region has an average light emitting element area A2, which differs from the light emitting element area A1 by within 10%. For example, assuming the area of each of the light emitting elements 240a is 100 mm², and the area of the light emitting region of the light emitting element group 200a is 400 mm². By dividing the area (400 mm²) of the light emitting region of the light emitting element group 200a by four, the average light emitting element area A2 of 100 mm² is obtained. The light emitting element area A1 can thus be between 90 and 110 mm². Similarly, assume that each of the light emitting elements 240b has a light emitting element area A3, and the light emitting region of the light emitting element group 200b has an average light emitting element area A4. The light emitting element area A3 and the average light emitting element area A4 have a difference of within 10%.

Further, in an embodiment, in the light emitting regions, a largest average light emitting element area is greater than 1.2 times the smallest average light emitting element area. Taking FIG. 2A for example, the average light emitting element area A2 of the light emitting element group 200a is the largest, and the average light emitting element area A4 of the light emitting element group 200b is the smallest, with A2 being greater than 1.2 times of A4. Further, a total area of all the light emitting elements 240a in the light emitting element group 200a and the light emitting elements 240b in the light emitting element group 200b is not greater than the area of the light emitting chip 200.

The light emitting elements 240a and the light emitting elements 240b are connected in series or in parallel. The number of the light emitting elements in each of the serially connected sections may be the same or different, and may be adjusted according to design requirements of the light emitting chip. The light emitting elements 240a and the light emitting elements 240b are electrically connected to one another, and further include a first external electrical contact 242 (e.g., a positive contact) and two second external electrical contacts 244a and 244b (e.g., negative contacts) disposed on three among of the light emitting elements. As shown in FIG. 2A, the first external electrical contact 242 is disposed on one of the light emitting elements 240a, e.g., the light emitting element 240a at the first row and first column of the light emitting element group 200a. The second external electrical contacts 244a and 244b are disposed on other light emitting elements, e.g., the one second external electrical contact 244a is disposed on the light emitting element 240a at the second row and first column of the light emitting element group 200a, and the other second external electrical contact 244b is disposed on the light emitting element 240b at the second row and first column of the light emitting element group 200b. The first external electrical contact 242 and the second external electrical contacts 244a and 244b are for coupling a power supply circuit 10 (shown in FIG. 13A), and receive two driving voltages outputted by the power supply circuit 10 for sectionally driving the light emitting elements 240a and 240b.

In another embodiment, instead of the one first external electrical contact and two second external electrical contacts, two first external electrical contacts (e.g., positive contacts) and one second external electrical contact (e.g., a negative contact) may be respectively disposed on three of the light emitting elements 240a and the light emitting elements 240b. The one positive contact and two negative contacts render the same effects as those rendered by the two positive contacts and one negative contact, as both can receive two driving voltages for sectional driving.

FIG. 2B shows a circuit diagram of the light emitting chip 200 in FIG. 2A. As shown in FIGS. 2A and 2B, the light emitting element group 200a includes four serially connected light emitting elements, and the light emitting element group 200b includes eight serially connected light emitting elements. The light emitting element groups 200a and 200b are electrically connected to one another in series. When applying a first-section voltage to the first external electrical contact 242 and the second external electrical contact 244a, only the light emitting element group 200a is conducted and illuminated. When applying a second-section voltage to the first external electrical contact 242 and the second external electrical contact 244b, both of the light emitting element groups 200a and 200b are conducted and illuminated.

Figure 3A:
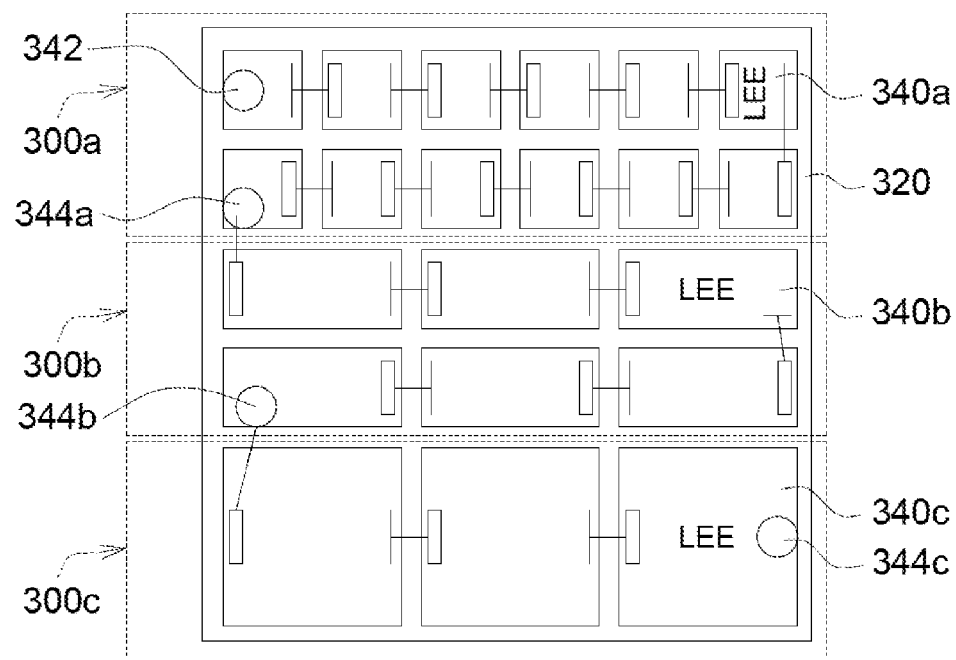
FIG. 3A is a schematic diagram of a light emitting chip according to an embodiment of the present invention.
Figure 3B:
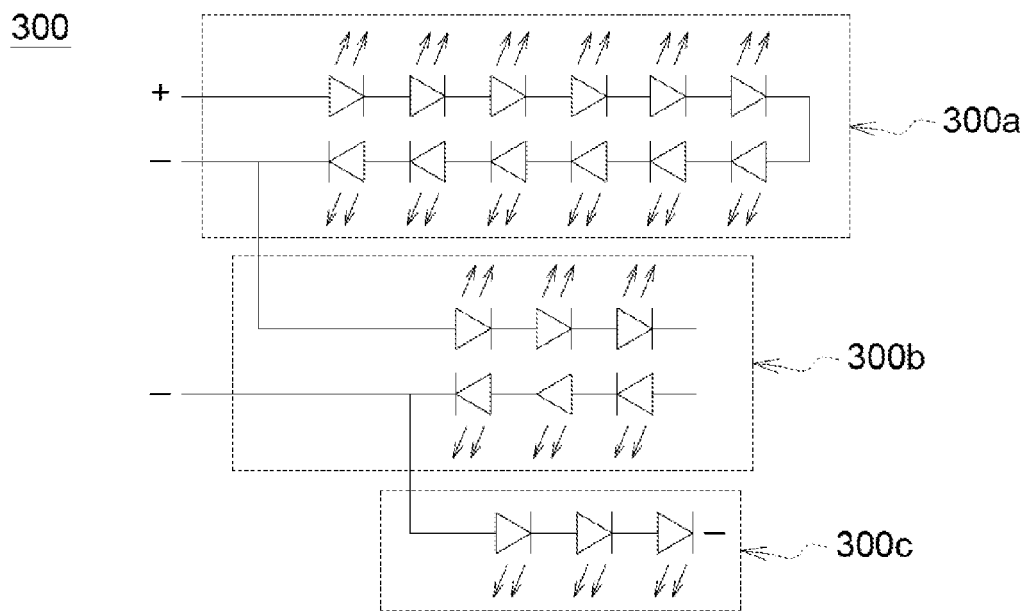
FIG. 3B is a circuit diagram of the light emitting chip in FIG. 3A.

FIG. 3A shows a schematic diagram of a light emitting chip 300 according to an embodiment of the present invention. FIG. 3B shows a circuit diagram of the light emitting chip 300 in FIG. 3A. Referring to FIGS. 3A and 3B, the light emitting chip 300 includes a substrate 320, a light emitting element group 300a, a light emitting element group 300b, and a light emitting element group 300c. The light emitting element groups 300a, 300b and 300c are arranged on the substrate 320. The light emitting element group 300a includes a plurality of light emitting elements 340a, the light emitting element group 300b includes a plurality of light emitting elements 340b, and the light emitting element group 300c includes a plurality of light emitting elements 340c. The light emitting elements 340a, 340b and 340c operate under a DC power supply.

In this embodiment, the area sizes of the light emitting elements 340a, 340b and 340c are different. The area size of a largest light emitting element (e.g., the light emitting element 340c) is substantially greater than 1.2 times the area of a smallest light emitting element (e.g., the light emitting element 340a). A total area of all the light emitting elements 340a, 340b and 340c is not greater than the area of the light emitting chip 300. The proportions depicted in FIG. 3A for are exemplification purposes only and are not to be construed as limitations to the present invention. In an embodiment, for example, the area of the light emitting element 340c is 10000 times the area of the light emitting element 340a. The light emitting chip 300 has three light emitting regions—light emitting element groups 300a, 300b and 300c. By dividing each of the light emitting regions by the number of light emitting elements within the corresponding region, an average light emitting element area corresponding to the light emitting region can be obtained. Further, the area of each light emitting element within each light emitting region and the average light emitting area of the light emitting region formed by the light emitting elements have a difference of within 10%.

The light emitting elements 340a, 340b and 340c may be connected in series or in parallel. The number of the light emitting elements in each of the serially connected sections may be the same or different, and may be adjusted according to design requirements of the light emitting chip. The light emitting elements 340a, 340b and 340c are electrically connected to one another, and further include a first external electrical contact 342 (e.g., a positive contact) and three second external electrical contacts 344a, 344b and 344c (e.g., negative contacts) disposed on four of the light emitting elements 340a, 340b and 340c. The first external electrical contact 342 and the second external electrical contacts 344a, 344b and 344c are for coupling a power supply circuit 10 (shown in FIG. 13A), and receive three driving voltages outputted by the power supply circuit 10 for sectionally driving the light emitting elements 340a, 340b and 340c. By providing three positive contacts and one negative contact, three driving voltages can also be received for sectional driving. Details of sectionally driving the light emitting chip 300 are similar to those of the light emitting chip 200 in FIGS. 2A and 2B, and shall be omitted herein.

Figure 4A:
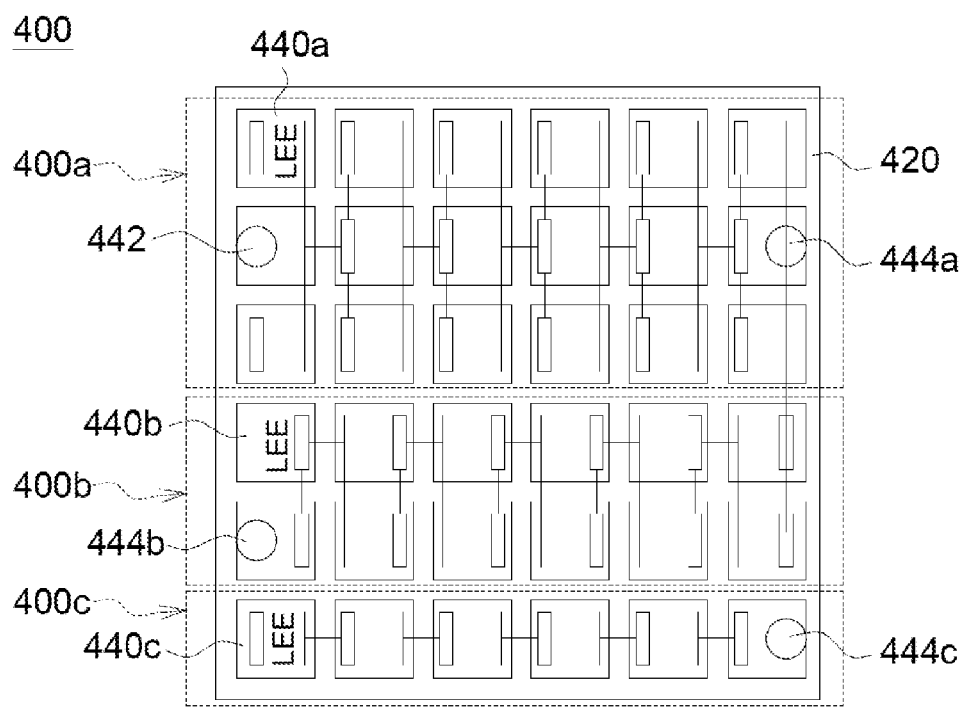
FIG. 4A is a schematic diagram of a light emitting chip according to an embodiment of the present invention.
Figure 4B:
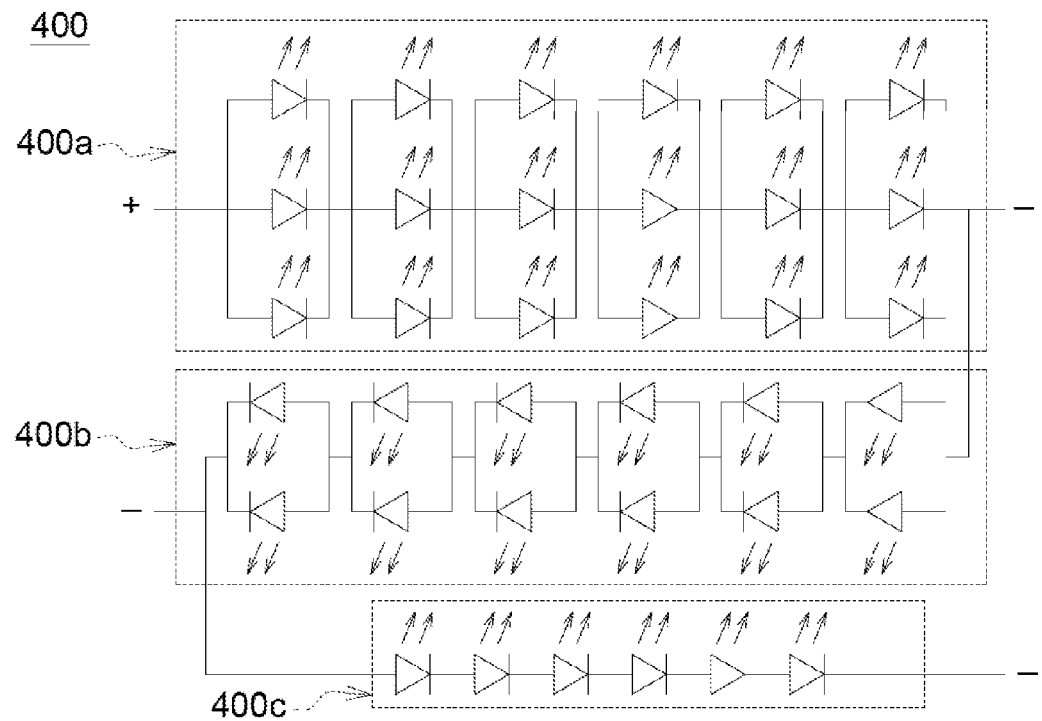
FIG. 4B is a circuit diagram of the light emitting chip in FIG. 4A.

FIG. 4A shows a schematic diagram of a light emitting chip 400 according to an embodiment of the present invention. FIG. 4B shows a circuit diagram of the light emitting chip 400 in FIG. 4A. Referring to FIGS. 4A and 4B, the light emitting chip 400 includes a substrate 420, a light emitting element group 400a, a light emitting element group 400b, and a light emitting element group 400c. The light emitting element groups 400a, 400b and 400c are arranged on the substrate 420. The light emitting element group 400a includes a plurality of light emitting elements 440a, the light emitting element group 400b includes a plurality of light emitting elements 440b, and the light emitting element group 400c includes a plurality of light emitting elements 440c. The light emitting elements 440a, 440b and 440c operate under a DC power supply.

In this embodiment, the number of the light emitting elements 440a connected in series (e.g., six serially connected light emitting elements 440a) in the light emitting element group 400a, the number of the light emitting elements 440b connected in series (e.g., six serially connected light emitting elements 440b) in the light emitting element group 400b, and the number of the light emitting elements 440c connected in series (e.g., six serially connected light emitting elements 440c) in the light emitting element group 400c are the same.

However, the number of the light emitting elements 440a connected in parallel (e.g., three light emitting elements connected in parallel) in the light emitting element group 400a, and the number of the light emitting elements 440b connected in parallel (e.g., two light emitting elements connected in parallel) in the light emitting element group 400b are different. Therefore, the areas of the light emitting regions of the light emitting element groups 400a, 400b and 400c are different.

It should be noted that FIG. 4A is for exemplification purposes only. The connection means as well as the numbers of the light emitting elements of the light emitting element groups in the series and parallel connections may be adjusted according to design requirements of the light emitting chip. Further, the light emitting elements 440a, 440b and 440c are electrically connected to one another, and further include a first external electrical contact 442 (e.g., a positive contact) and three second external electrical contacts 444a, 444b and 444c (e.g., negative contacts) disposed on four among of the light emitting elements 440a, 440b and 440c. The first external electrical contact 442 and the second external electrical contacts 444a, 444b and 444c are for coupling a power supply circuit 10 (shown in FIG. 13A), and receive three driving voltages outputted by the power supply circuit 10 for sectionally (e.g., three sections) driving the light emitting elements 440a, 440b and 440c. By providing three positive contacts and one negative contact, three driving voltages can also be received for sectional driving. Details of sectionally driving the light emitting chip 400 are similar to those of the light emitting chip 200, and shall be omitted herein.

Figure 5A:
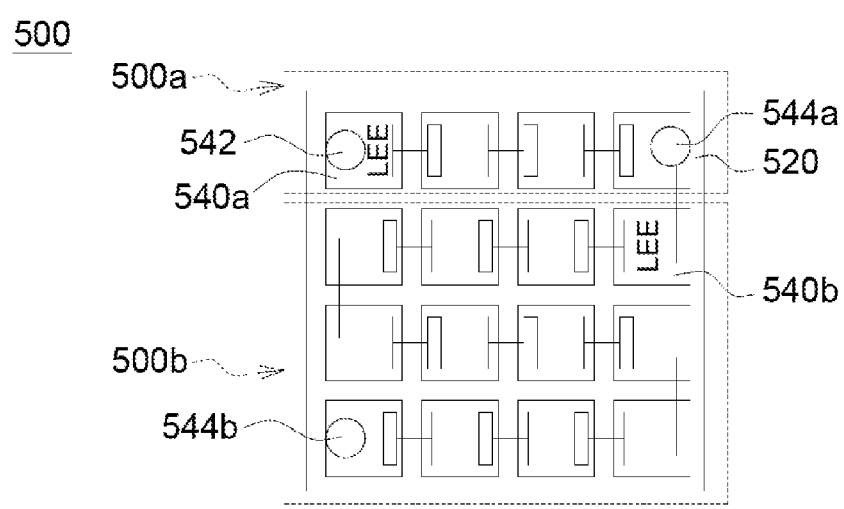
FIG. 5A is a schematic diagram of a light emitting chip according to an embodiment of the present invention.
Figure 5B:
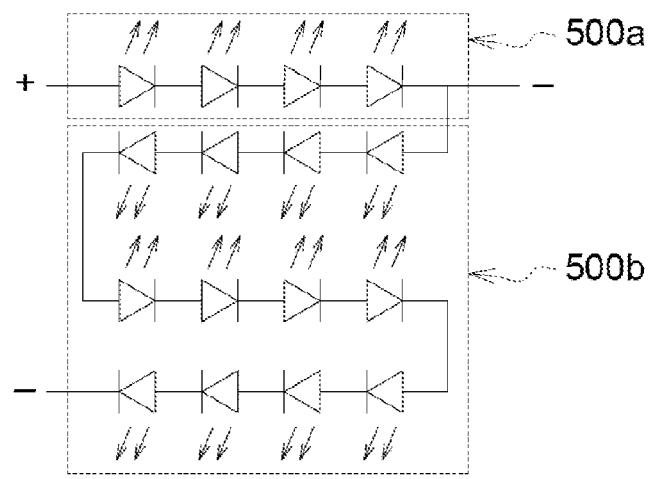
FIG. 5B is a circuit diagram of the light emitting chip in FIG. 5A.

FIG. 5A shows a schematic diagram of a light emitting chip 500 according to an embodiment of the present invention. Referring to FIG. 5A, the light emitting chip 500 includes a substrate 520, and a light emitting element group 500a and a light emitting element group 500b arranged on the substrate 520. The light emitting element group 500a includes a plurality of light emitting elements 540a, and the light emitting element group 500b includes a plurality of light emitting elements 540b. The light emitting elements 540a and 540b (e.g., light emitting diodes) operate under a DC power supply.

In this embodiment, the light emitting element groups 500a and 500b respectively include different numbers of light emitting elements connected in series, such that the areas of the light emitting regions of the light emitting element groups 500a and 500b are different. The number of the light emitting elements 540a and 540b connected in series may be adjusted according to design requirements of the light emitting chip. The light emitting elements 540a and 540b are electrically connected to one another. A first external electrical contact 542 (e.g., a positive contact) and two external electrical contacts 544a and 544b (e.g., negative contacts) are respectively disposed on three of the light emitting elements 540a and 540b. Taking FIG. 5A for example, all the light emitting elements are arranged in four rows and four columns. For example, the first external electrical contact 542 is disposed on the light emitting element 540a at the first row and first column of the light emitting element group 500a, and the second external electrical contacts 544a and 544b are respectively disposed on the light emitting element 540a at the first row and last column of the light emitting element group 500a and the light emitting element 540b at the last row and first column of the light emitting element group 500b. The first external electrical contact 542 and the second external electrical contacts 544a and 544b are for coupling a power supply circuit 10 (shown in FIG. 13A), and receive two driving voltages outputted by the power supply circuit 10 for sectionally driving the light emitting elements 540a and 540b.

Details of sectionally driving the light emitting chip 500 are similar to those of the light emitting chip 200, and shall be omitted herein.

In another embodiment, instead of providing one external first external electrical contact and two second external electrical contacts, two first external electrical contacts (e.g., positive contacts) and one second external electrical contact (e.g., a negative contact) may be disposed on three of the light emitting elements 540a and 540b. The one positive contact and two negative contacts render the same effects as those rendered by the two positive contacts and one negative contact, as both can receive two driving voltages for sectional driving.

Figure 6A:
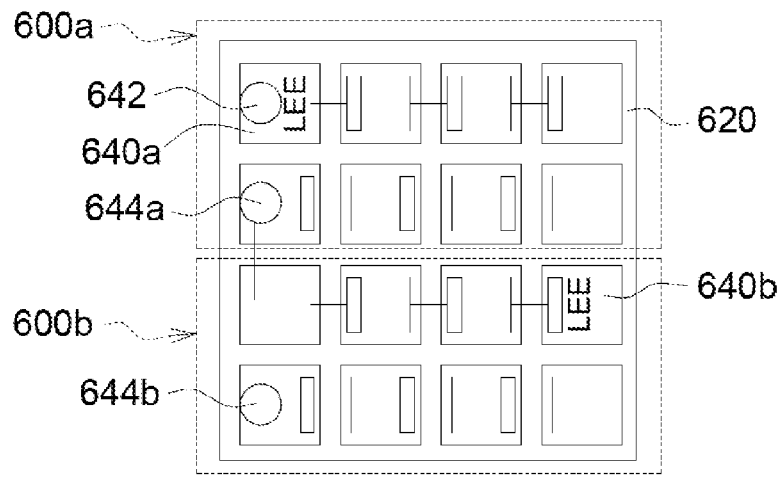
FIG. 6A is a schematic diagram of a light emitting chip according to an embodiment of the present invention.
Figure 6B:
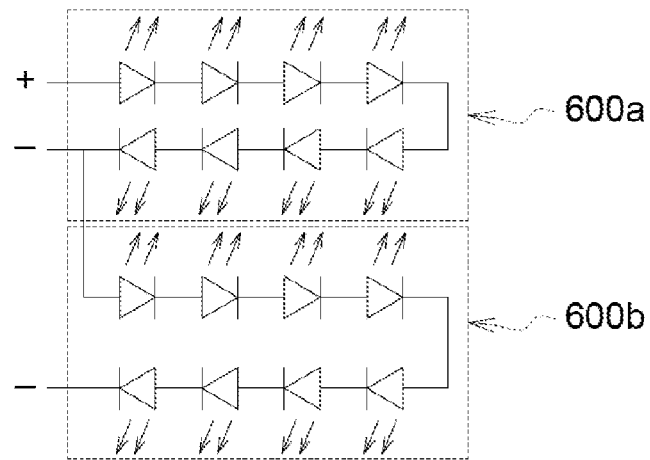
FIG. 6B is a circuit diagram of the light emitting chip in FIG. 6A.

FIG. 6A shows a schematic diagram of a light emitting chip 600 according to an embodiment of the present invention. FIG. 6B shows a circuit diagram of the light emitting chip 600 in FIG. 6A. Referring to FIGS. 6A and 6B, the light emitting chip 600 includes a substrate 620, and a light emitting element group 600a and a light emitting element group 600b arranged on the substrate 620. The light emitting element group 600a includes a plurality of light emitting elements 640a, and the light emitting element group 600b includes a plurality of light emitting elements 640b. The light emitting elements 640a and 640b operate under a DC power supply. A first external electrical contact 642 (e.g., a positive contact) and two external electrical contacts 644a and 644b (e.g., negative contacts) are respectively disposed on three of the light emitting elements 640a and 640b.

Operation details of the light emitting chip 600 in this embodiment are similar to those of the light emitting chip 500 of the abovementioned embodiment, and the similarities shall be omitted herein. A main difference between the two embodiments is that the configuration of the second external electrical contacts 644a and 644b is different from that of the second external electrical contacts 544a and 544b.

Figure 7A:
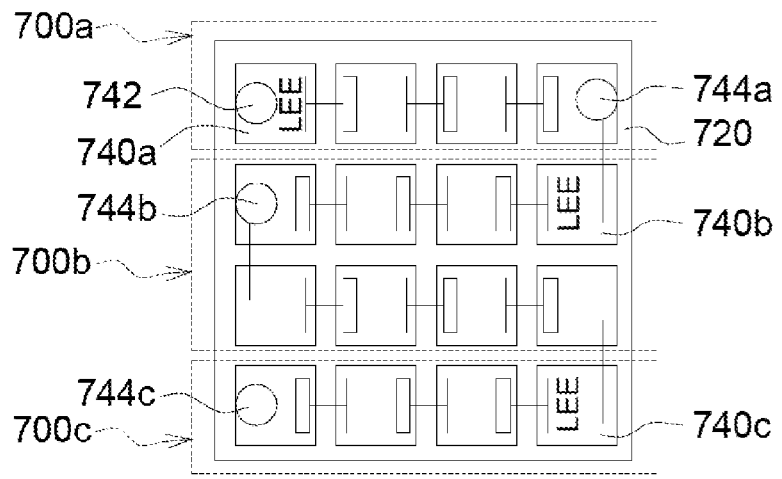
FIG. 7A is a schematic diagram of a light emitting chip according to an embodiment of the present invention.
Figure 7B:
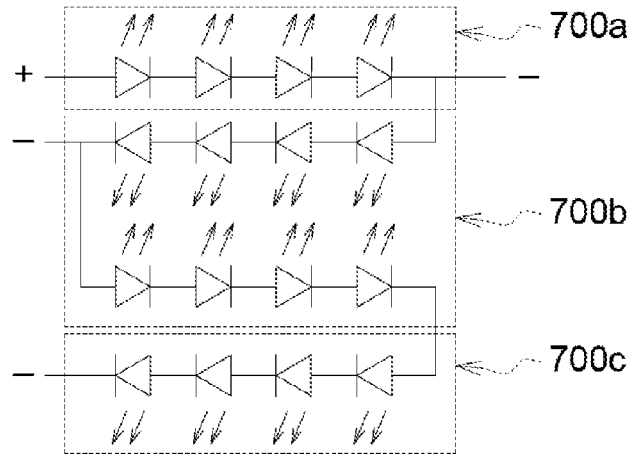
FIG. 7B is a circuit diagram of the light emitting chip in FIG. 7A.

FIG. 7A shows a schematic diagram of a light emitting chip 700 according to an embodiment of the present invention. FIG. 7B shows a circuit diagram of the light emitting chip 700 in FIG. 7A. Referring to FIGS. 7A and 7B, the light emitting chip 700 includes a substrate 720, a light emitting element group 700a, a light emitting element group 700b, and a light emitting element group 700c. The light emitting element groups 700a, 700b and 700c are arranged on the substrate 720. The light emitting element group 700a includes a plurality of light emitting elements 740a, the light emitting element group 700b includes a plurality of light emitting elements 740b, and the light emitting element group 700c includes a plurality of light emitting elements 740c. The light emitting elements 740a, 740b and 740c operate under a DC power supply.

In this embodiment, the light emitting elements 740a of the light emitting element group 700a, the light emitting elements 740b of the light emitting element group 700b and the light emitting elements 740c of the light emitting element group 700c are respectively connected in series, and the numbers of each of the serially connected sections may be different. Assuming that the numbers of the light emitting elements connected in each of the light emitting section of the light emitting element groups are different, the numbers of the light emitting elements connected in each of the light emitting sections may be adjusted according to design requirements of the light emitting chip. The light emitting elements 740a, 740b and 740c are electrically connected to one another, and further include a first external electrical contact 742 (e.g., a positive contact) and three second external electrical contacts 744a, 744b and 744c (e.g., negative contacts) disposed on four of the light emitting elements 740a, 740b and 740c.

Details of sectionally driving the light emitting chip 700 are similar to those of the light emitting chip 200, and shall be omitted herein.

Figure 8A:
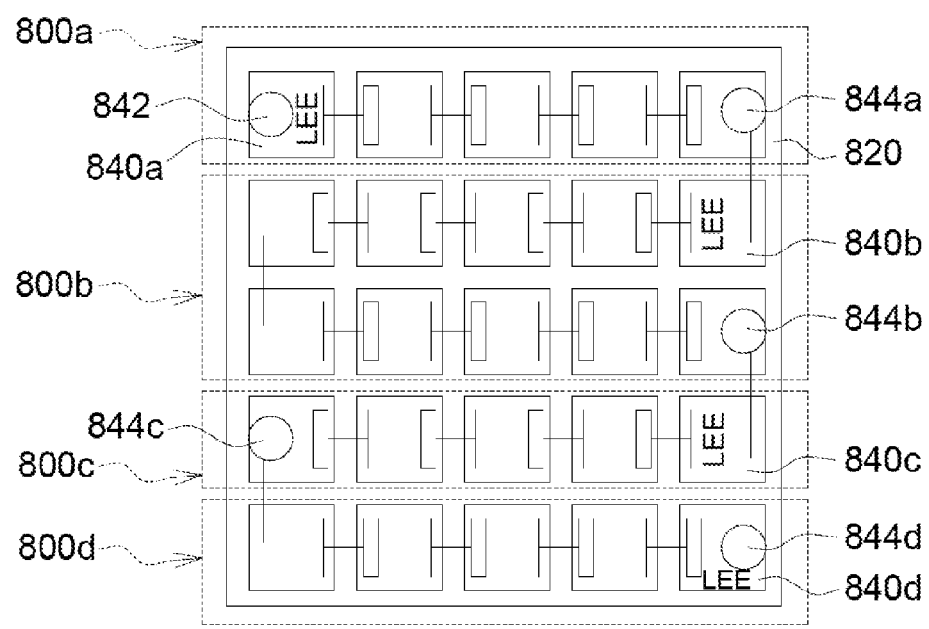
FIG. 8A is a schematic diagram of a light emitting chip according to an embodiment of the present invention.
Figure 8B:
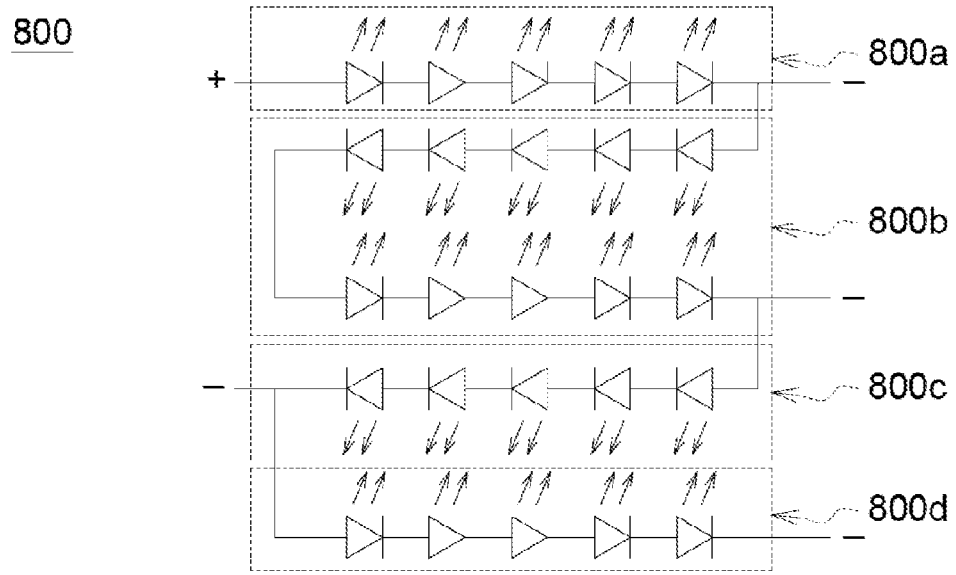
FIG. 8B is a circuit diagram of the light emitting chip in FIG. 8A.

FIG. 8A shows a schematic diagram of a light emitting chip 800 according to an embodiment of the present invention. FIG. 8B shows a circuit diagram of the light emitting chip 800 in FIG. 8A. Referring to FIGS. 8A and 8B, the light emitting chip 800 includes a substrate 820, a light emitting element group 800a, a light emitting element group 800b, a light emitting element group 800c, and a light emitting element group 800d. The light emitting element groups 800a to 800d are arranged on the substrate 820. The light emitting element groups 800a to 800d respectively include light emitting elements 840a to 840d. The light emitting elements 840a to 840d operate under a DC power supply.

In this embodiment, the numbers of the light emitting elements 840a to 840d connected in series in the light emitting element groups 800a to 800d are different, such that the areas of light emitting regions of the light emitting element groups 800a to 800d are different. In another embodiment, for example, the numbers of the of the light emitting elements 840a to 840d connected in series in the light emitting element groups 800a to 800d may be the same. It should be noted that FIG. 8A is for exemplification purposes only, and the numbers of the light emitting elements connected in series in the light emitting element groups may be adjusted according to design requirements of the light emitting chip. Further, the light emitting elements 840a to 840d are electrically connected to one another, and include a first external electrical contact 842 (e.g., a positive contact) and four second external electrical contacts 844a to 844d (e.g., negative contacts). The first external electrical contact 842 and the four second external electrical contacts 844a to 844d are respectively disposed on five of the light emitting elements 840a to 840d. Details of sectionally driving the light emitting chip800 are similar to those of the light emitting chip 200, and shall be omitted herein.

Figure 9A:
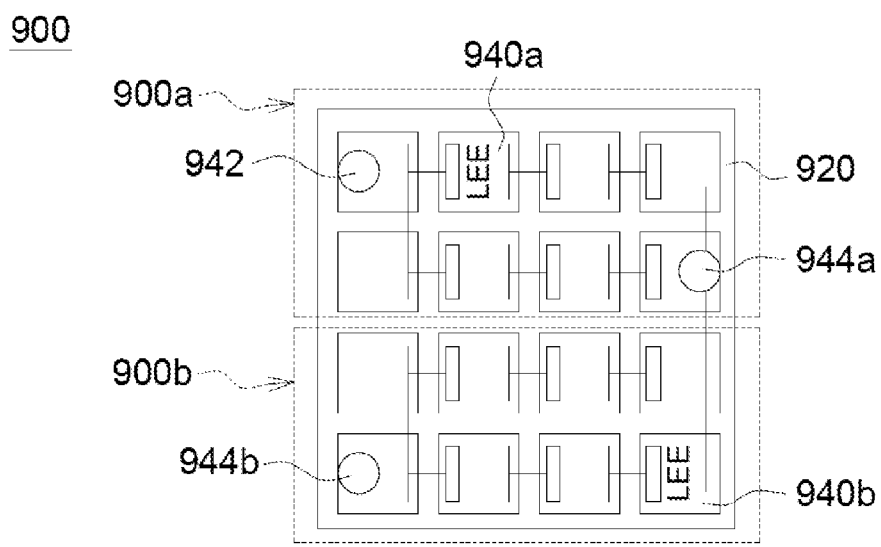
FIG. 9A is a schematic diagram of a light emitting chip according to an embodiment of the present invention.
Figure 9B:
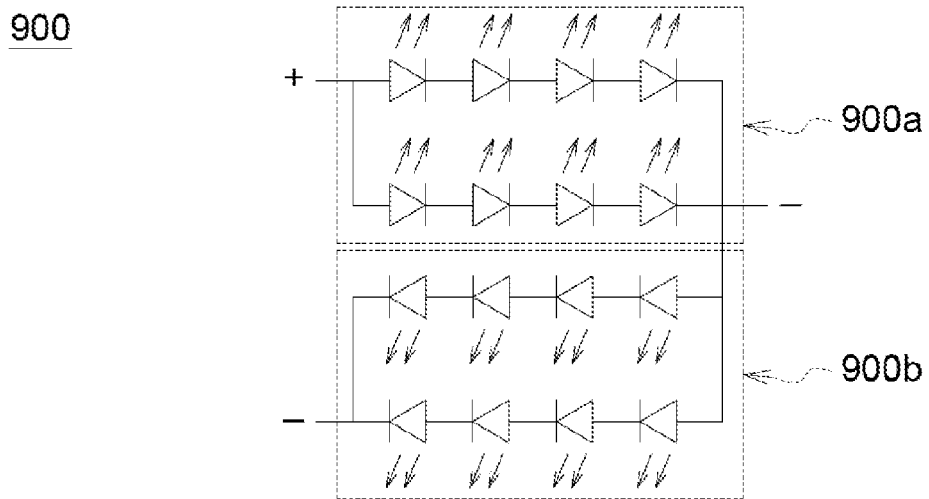
FIG. 9B is a circuit diagram of the light emitting chip in FIG. 9A.

FIG. 9A shows a schematic diagram of a light emitting chip 900 according to an embodiment of the present invention. FIG. 9B shows a circuit diagram of the light emitting chip 900 in FIG. 9A. Referring to FIGS. 9A and 9B, the light emitting chip 900 includes a substrate 920, and a light emitting element group 900a and a light emitting element group 900b arranged on the substrate 920. The light emitting element group 900a includes a plurality of light emitting elements 940a, and the light emitting element group 900b includes a plurality of light emitting elements 940b. The light emitting elements 940a and 940b operate under a DC power supply.

In this embodiment, the numbers of the light emitting elements 940a connected in series and in parallel in the light emitting element group 900a are the same as the numbers of the light emitting elements 940b connected in series and in parallel in the light emitting element group 900b (e.g., four light emitting elements connected in series and two light emitting elements connected in parallel). Thus, the areas of the light emitting regions of the light emitting element groups 900a and 900b are the same. It should be noted that FIGS. 9A and 9B are for exemplification purposes only, and connection means as well as the numbers of light emitting elements in the series and parallel connections of the light emitting element groups may be adjusted according to design requirements of the light emitting chip.

Further, the light emitting elements 940a and 940b are electrically connected to one another, and include first external electrical contact 942 (e.g., a positive contact) and two external electrical contacts 944a and 944b (e.g., negative contacts) respectively disposed on three of the light emitting elements 940a and 940b. Details of sectionally driving the light emitting chip 900 are similar to those of the light emitting chip 200, and shall be omitted herein.

Second Embodiment

Figure 10A:
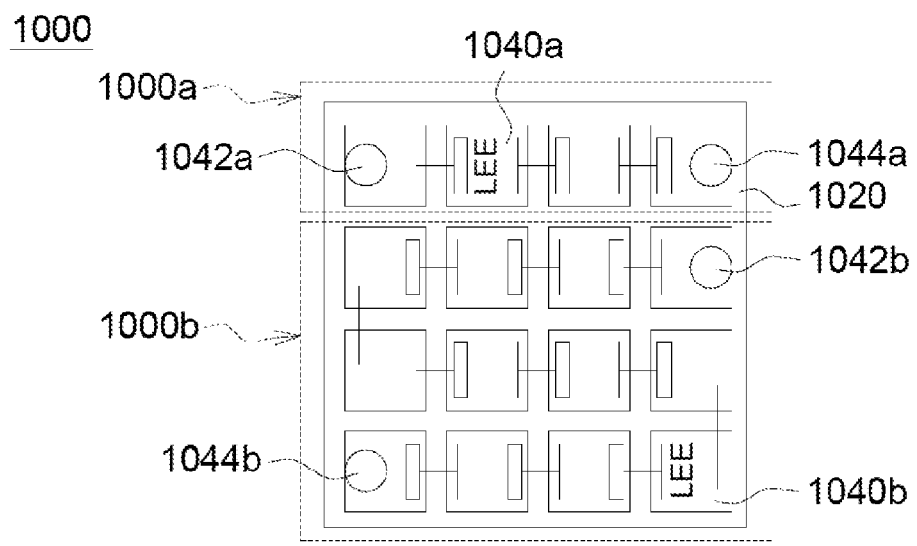
FIG. 10A is a schematic diagram of a light emitting chip according to an embodiment of the present invention.
Figure 10B:
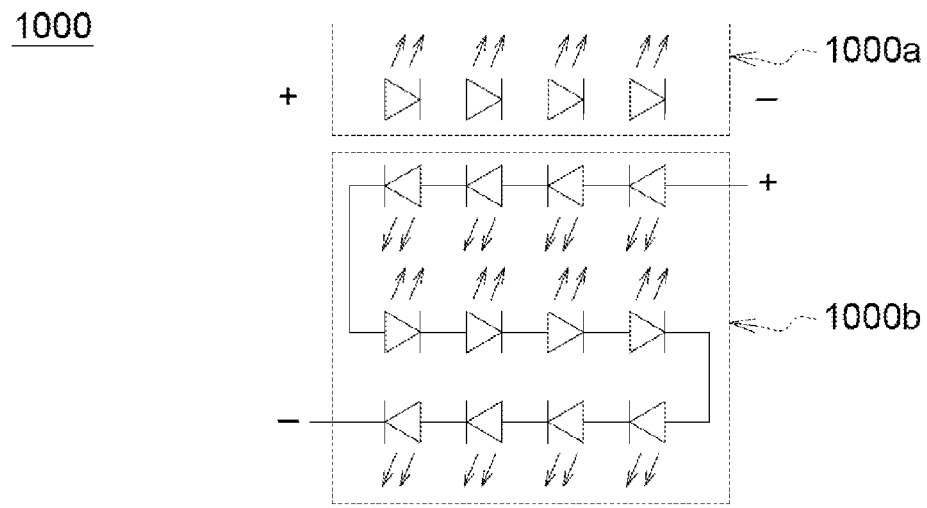
FIG. 10B is a circuit diagram of the light emitting chip in FIG. 10A.

FIG. 10A shows a schematic diagram of a light emitting chip 1000 according to an embodiment of the present invention. FIG. 10B shows a circuit diagram of the light emitting chip 1000 in FIG. 10A. Referring to FIGS. 10A and 10B, the light emitting chip 1000 includes a substrate 1020, and a light emitting element group 1000a and a light emitting element group 1000b arranged on the substrate 1020. The light emitting element group 1000a includes a plurality of light emitting elements 1040a, and the light emitting element group 1000b includes a plurality of light emitting elements 1040b. The light emitting elements 1040a and 1040b (e.g., light emitting diodes) operate under a DC power supply.

In this embodiment, the number of the light emitting elements 1040a connected in series in the light emitting element group 1000a and the number of the light emitting elements 1040b connected in series in the light emitting element group 1000b are different, such that the areas of the light emitting regions of the light emitting element groups 1000a and 1000b are different. It should be noted that FIGS. 10A and 10B are for exemplification purposes only, and the numbers of the light emitting elements connected in series in the light emitting element groups may be adjusted according to design requirements of the light emitting chip. Further, the light emitting element groups 1000a and 1000b are not electrically connected to each other, and independently receive a single driving voltage and are driven by the respective driving voltages.

A first external electrical contact 1042a and a first external electrical contact 1042b (e.g., positive contacts) are respectively disposed on one of the light emitting elements 1040a and one of the light emitting elements 1040b. For example, the first external electrical contact 1042a is disposed on the light emitting element 1040a at the first row and first column of the light emitting element group 1000a, and the first external electrical contact 1042b is disposed on the light emitting element 1040b at the first row and last column of the light emitting element group 1000b. A second external electrical contact 1044a and a second external electrical contact 1044b (e.g., negative contacts) are respectively disposed on one of the light emitting elements 1040a and one of the light emitting elements 1040b. For example, the second external electrical contact 1044a is disposed on the light emitting element 1040a at the first row and last column of the light emitting element group 1000a, and the second external electrical contact 1044b is disposed on the light emitting element 1040b at the last row and first column of the light emitting element group 1000b. The first external electrical contacts 1042a and 1042b and the second external electrical contacts 1044a and 1044b are for coupling a power supply circuit 10 (shown in FIG. 13A), and receive two sets of driving voltages outputted by the power supply circuit 10 for sectionally driving (e.g., two sections) the light emitting elements 1040a and 1040b.

Figure 11A:
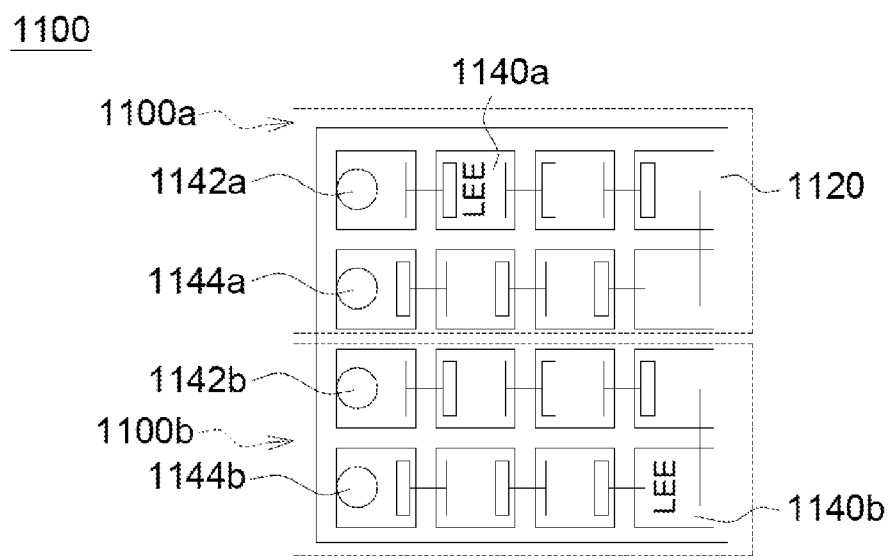
FIG. 11A is a schematic diagram of a light emitting chip according to an embodiment of the present invention.
Figure 11B:
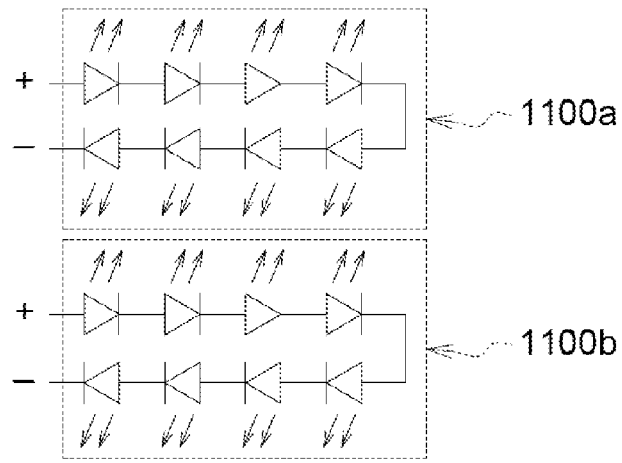
FIG. 11B is a circuit diagram of the light emitting chip in FIG. 11A.

FIG. 11A shows a schematic diagram of a light emitting chip 1100 according to an embodiment of the present invention. FIG. 11B shows a circuit diagram of the light emitting chip 1100 in FIG. 11A. Referring to FIGS. 11A and 11B, the light emitting chip 1100 includes a substrate 1120, and a light emitting element group 1100a and a light emitting element group 1100b arranged on the substrate 1120. The light emitting element group 1100a includes a plurality of light emitting elements 1140a, and the light emitting element group 1100b includes a plurality of light emitting elements 1140b. Operation details of the light emitting elements 1140a and 1140b in this embodiment are similar to those of the light emitting elements 1040a and 1040b of the above-mentioned embodiment, and the similarities shall be omitted herein. A difference between the embodiments is that the number of the light emitting elements 1140a connected in series in the light emitting element group 1100a and the number of the light emitting elements 1140b connected in series in the light emitting element group 1100b are the same (e.g., eight light emitting elements connected in series in both of the light emitting element groups).

A first external electrical contact 1142a and a first external electrical contact 1142b (e.g., positive contacts) are respectively disposed on one of the light emitting elements 1140a and one of the light emitting elements 1140b, e.g., respectively disposed on the light emitting element 1140a at the first row and first column in the light emitting element group 1100a and the light emitting element 1140b at the first row and first column in the light emitting element group 1100b. A second external electrical contact 1144a and a second external electrical contact 1144b (e.g., negative contacts) are respectively disposed on one of the light emitting elements 1140a and one of the light emitting elements 1140b, e.g., respectively disposed on the light emitting element 1140a at the last row and first column of the light emitting element group 1100a and the light emitting element 1140b at the last row and first column of the light emitting element group 1100b.

Figure 12A:
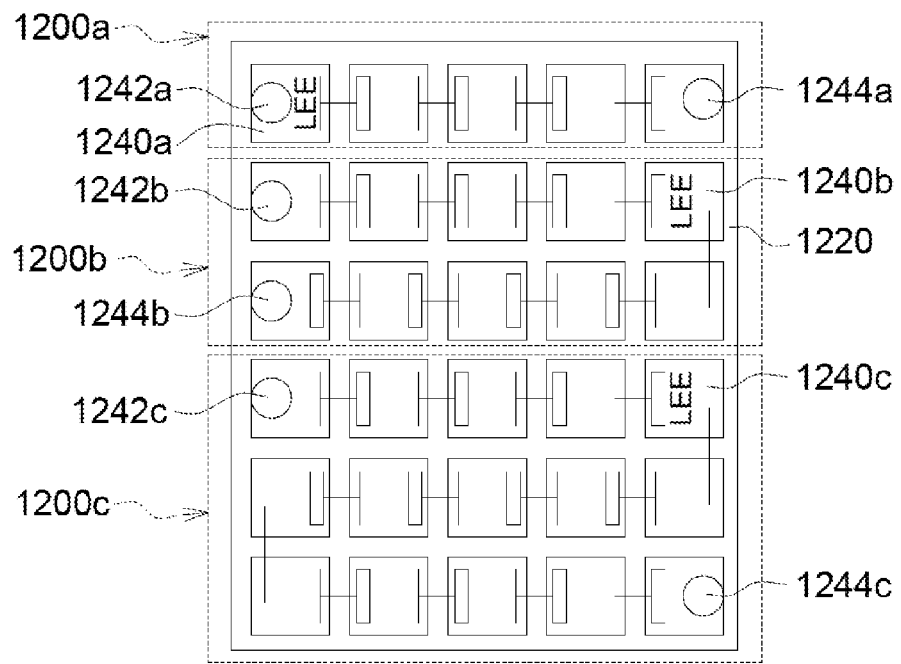
FIG. 12A is a schematic diagram of a light emitting chip according to an embodiment of the present invention.
Figure 12B:
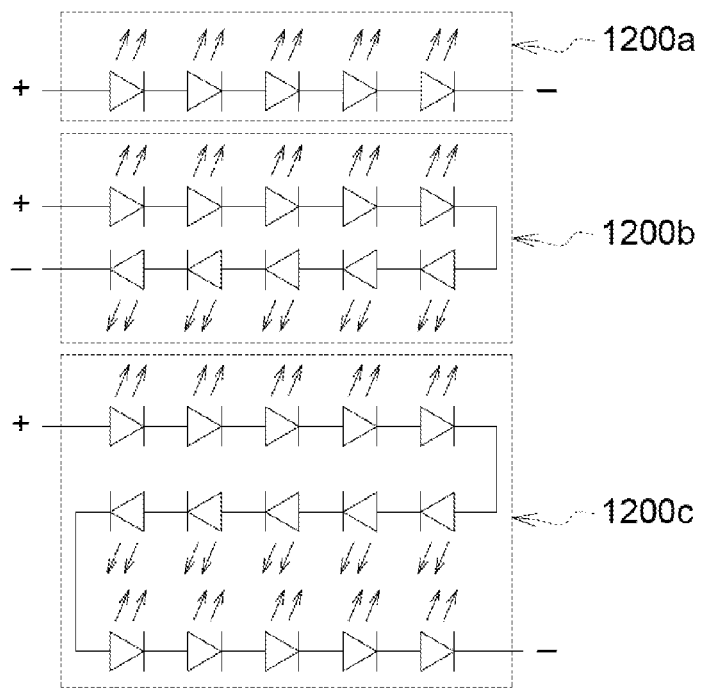
FIG. 12B is a circuit diagram of the light emitting chip in FIG. 12A.

FIG. 12A shows a schematic diagram of a light emitting chip 1200 according to an embodiment of the present invention. FIG. 12B shows a circuit diagram of the light emitting chip 1200 in FIG. 12A. Referring to FIGS. 12A and 12B, the light emitting chip 1200 includes a substrate 1220, a light emitting element group 1200a, a light emitting element group 1200b, and a light emitting element group 1200c. The light emitting element groups 1200a, 1200b and 1200c are arranged on the substrate 1220. The light emitting element group 1200a includes a plurality of light emitting elements 1240a, the light emitting element group 1200b includes a plurality of light emitting elements 1240b, and the light emitting element group 1200c includes a plurality of light emitting elements 1240c. Operation details of the light emitting elements 1240a, 1240b and 1240c are similar to those of the light emitting elements 1040a and 1040b, and the numbers of the light emitting elements 1240a, 1240b and 1240c in the light emitting element groups 1200a, 1200b and 1200c are different. Details of the similarities shall be omitted herein. A difference is that the light emitting chip 1200 includes three sets of independent light emitting element groups 1200a, 1200b and 1200c, and the light emitting chip 1000 in FIG. 10A includes only two sets of independent light emitting groups 1000a and 1000b.

A first external electrical contact 1242a, a first external electrical contact 1242b and a first external electrical contact 1242c (e.g., positive contacts) are respectively disposed on one of the light emitting elements 1240a of the light emitting element group 1200a, one of the light emitting elements 1240b of the light emitting element group 1200b and one of the light emitting elements 1240c of the light emitting element group 1200c, e.g., respectively disposed on a light emitting element at the first row and first column of the light emitting element groups 1200a, 1200b and 1200c. A second external electrical contact 1244a, a second external electrical contact 1244b and a second external electrical contact 1244c (e.g., negative contacts) are respectively disposed on one of the light emitting elements 1240a, one of the light emitting elements 1240b and one of the light emitting elements 1240c, e.g., respectively disposed on a light emitting element at the last row and last column, the last row and first column, or the last row and last column of the light emitting element groups 1200a, 1200b and 1200c. The first external electrical contacts 1242a, 1242b and 1242c and the second external electrical contacts 1244a, 1244b and 1244c are for coupling a power supply circuit to achieve sectional driving (e.g., three sections).

Light Emitting Device Applying Light Emitting Chip of Above Embodiments

Figure 13A:
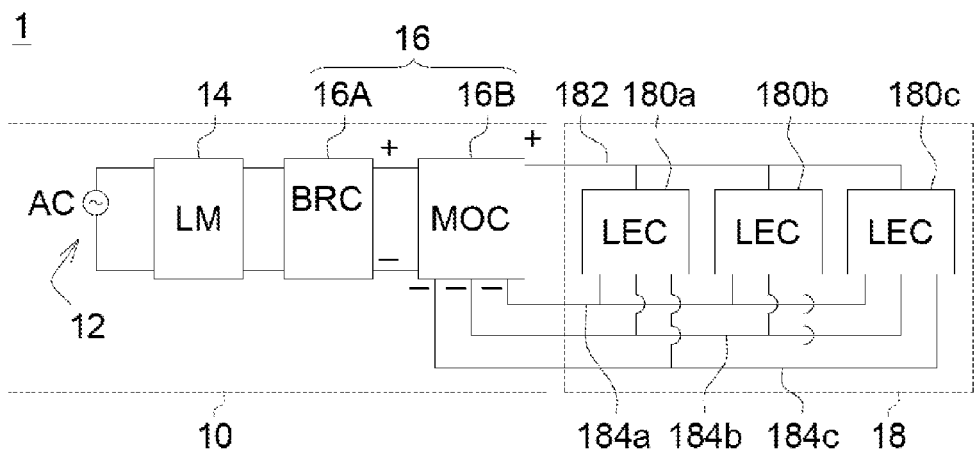
FIG. 13A is a schematic diagram of a light emitting device according to an embodiment of the present invention.
Figure 13B:
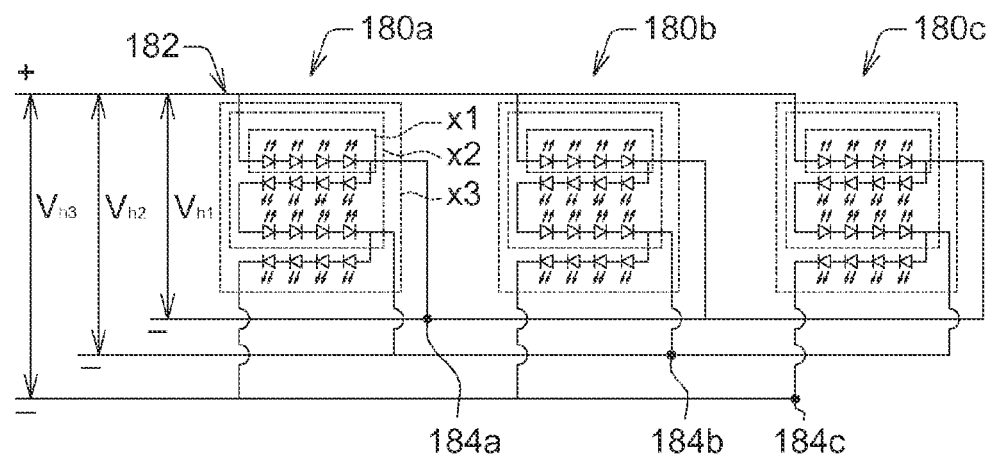
FIG. 13B is a circuit diagram of a light source module in FIG. 13A.

FIG. 13A shows a schematic diagram of a light emitting device according to an embodiment of the present invention. FIG. 13B shows a circuit diagram of a light source module as shown in FIG. 13A. Referring to FIG. 13A, a light emitting device 1 includes a power supply circuit 10 and a light source module 18. The power supply circuit 10 includes an AC power supply 12 (e.g., a market AC power supply), a light modulator 14, and a multi-output linear power driver 16. The multi-output linear power driver 16 may include a bridge rectifier circuit 16A and a multi-output circuit 16B. The bridge rectifier circuit 16A, coupled to the light modulator 14, transforms a phase-modulated AC power to a DC power. The multi-output circuit 16B, coupled to the bridge rectifier circuit 16A, includes a plurality of high-potential output terminals and a plurality of low-potential output terminals. The high-potential output terminals are coupled to a first external electrical contact 182, and the low-potential output terminals are respectively coupled to second external electrical contacts 184a to 184c.

The light modulator 14, coupled to the AC power supply 12, modulates a phase of an AC power inputted by the AC power supply 12 to output a phase-modulated AC power. The power supply circuit 10 is coupled to the first external electrical contact 182 and the second external electrical contacts 184a to 184c of a light emitting chip 180a, the first external electrical contact 182 and the second external electrical contacts 184a to 184c of a light emitting chip 180b, and the first external electrical contact 182 and the second external electrical contacts 184a to 184c of a light emitting chip 180c of the light source module 18.

The multi-output linear power driver 16 is coupled to the light modulator 14, the first external electrical contacts 182 and the second external electrical contacts 184a to 184c. The multi-output linear power driver 16 transforms the phase-modulated AC power to a DC power, and outputs a plurality of DC driving voltages to the first and second external electrical contacts. In the light emitting device 1 shown in FIG. 13A, for example, the light emitting chips 180a, 180b and 180c are light emitting chips that receive three driving voltages for three-section driving. In practice, the light emitting chips in the light emitting device 1 may be light emitting chips disclosed in any of the foregoing embodiments.

Figure 13C:
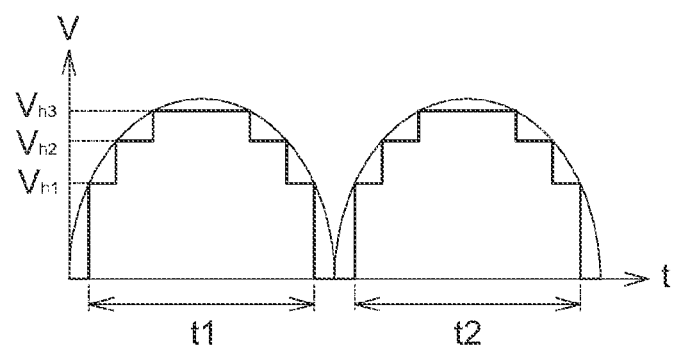
FIG. 13C is a circuit diagram of the light emitting device in FIGS. 13A and 13B.

FIG. 13C shows a diagram depicting a relationship between a conduction time and a conduction voltage of the sectionally conducted light emitting chips in FIGS. 13A and 13B. Referring to FIGS. 13A to 13C, when the light emitting device 1 (in FIG. 13A) receives a first-section input voltage $V_{h1}$ provided by the multi-output linear power driver 16, only light emitting elements at a first section x1 are illuminated. When the light emitting device 1 (in FIG. 13A) receives a second-section input voltage $V_{h2}$ provided by the multi-output linear power driver 16, in addition to the light emitting elements at the first section x1, light emitting elements at a second section x2 are also illuminated. When the light emitting device 1 (in FIG. 13A) receives a third-section input voltage $V_{h3}$ provided by the multi-output linear power driver 16, in addition to the light emitting elements at the first section x1 and the second section x2, light emitting elements at a third section x3 are also illuminated. The light emitting elements are illuminated for a continuous period t1. In a next driving process, the steps of applying the input voltages $V_{h1}$ to $V_{h3}$ are repeated, and the light emitting elements are illuminated for a continuous period t2. Thus, through the light emitting device 1 that sectionally illuminates the light emitting chips 180a to 180c, the conduction time of the light emitting elements are prolonged. In this embodiment, a light emitting device that illuminates the light emitting elements in three sections is taken as an example. In another embodiment, the number of illumination sections of the light emitting device may be adjusted according to actual requirements. As the number of the illumination sections increases, the waveform of the illumination of the light emitting device appears closer to external arcs.

Figure 14A:
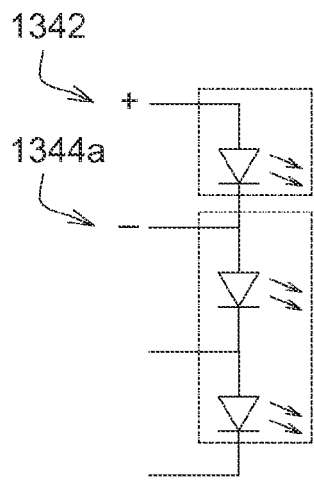
FIGS. 14A to 14C are schematic diagrams of sectionally conducting light emitting chips according to an embodiment of the present invention.
Figure 14B:
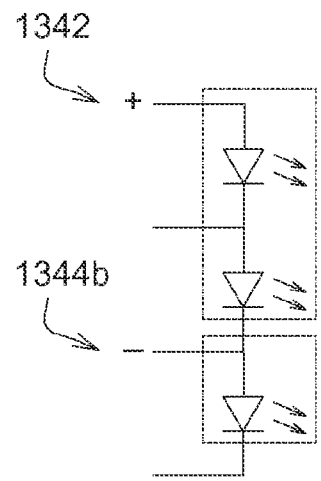
Figure 14C:
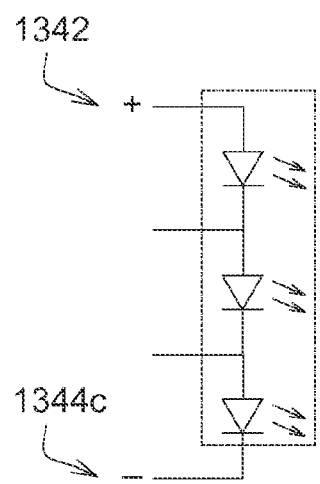

FIGS. 14A to 14C show schematic diagrams of sectional conduction of a light emitting chip according to an embodiment of the present invention. Referring to FIG. 14A, during a first-phase conduction, only a light emitting element between a first external electrical contact 1342 (e.g., a positive contact) and a second external electrical contact 1344a (e.g., a negative contact) is conducted and illuminated. Referring to FIG. 14B, during a second-phase conduction, only light emitting elements between the first external electrical contact 1342 and a second external electrical contact 1344b (e.g., a negative contact) are conducted and illuminated. Referring to FIG. 14C, during a third-phase conduction, all the light emitting elements between the first external electrical contact 1342 and a third external electrical contact 1344c (e.g., a negative contact) are conducted and illuminated.

With the above embodiments of the present invention, a light emitting chip and a light emitting device applying the light emitting chip are provided. The areas of light emitting elements in the light emitting chip are differently-sized, and may be driven by a single driving voltage or sectionally driven by a plurality of driving voltages. Further, in the light emitting chip according to different embodiments of the present invention, by configuring the light emitting areas, serial or parallel connections and connection means of the light emitting elements in the light emitting chip, the light emitting approach (e.g., illuminating by section or by group) and the light emitting density of the light emitting chip can be adjusted.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting chip, operating under a DC power supply, comprising:
   a substrate;
   a plurality of light emitting elements, electrically connected to each other and arranged on the substrate, having same or different area sizes, and sectionally driven by a plurality of driving voltages, wherein the light emitting elements are divided into a first light emitting element group and a second light emitting element group; and
   a first external electrical contact and a plurality of second external electrical contacts disposed on light emitting elements for receiving the driving voltages, wherein when a first-section driving voltage is applied to the first light emitting element group, the first light emitting element group is conducted between the first external electrical contact and one of the second external electrical contacts; when a second-section voltage is applied to the first light emitting element group and the second light emitting element group, both of the first and second light emitting element groups are conducted between the first external electrical contact and another of the second external electrical contacts, wherein the first external electrical contact is a positive contact and the second external electrical contacts are negative contacts electrically connected in series.

2. The light emitting chip according to claim 1, wherein the light emitting element having a largest area is greater than 1.2 times the light emitting element having a smallest area, and a total area of the light emitting elements is not greater than an area of the light emitting chip.

3. The light emitting chip according to claim 1, wherein the light emitting elements form a plurality of light emitting regions, and each of the light emitting regions has a respective average light emitting element area.

4. The light emitting chip according to claim 3, wherein an area of each of the light emitting elements in each of the light emitting regions and the average light emitting element area of the light emitting region formed by the light emitting elements have a difference of within 10%.

5. The light emitting chip according to claim 4, wherein an area size of a largest light emitting element is greater than 1.2 times an area size of a smallest light emitting element, and a total area of the light emitting elements is not greater than an area of the light emitting chip.

6. The light emitting chip according to claim 3, wherein the second external electrical contacts are respectively disposed on one of the light emitting regions.

7. The light emitting chip according to claim 3, wherein the light emitting regions are connected in series or connected in parallel.

8. The light emitting chip according to claim 1, wherein the light emitting elements are light emitting diodes.

9. A light emitting device, comprising:
the light emitting chip of claim 1, and
a power supply circuit, coupled to the first and second external electrical contacts of the light emitting chip, comprising:
an AC power supply;
a light modulator, coupled to the AC power supply, for modulating a phase of an AC power inputted by the AC power supply and outputting a phase-modulated AC power; and
a multi-output linear power driver, coupled to the light modulator and the first and second external electrical contacts, for transforming the phase-modulated AC power to a DC power, and outputting a plurality of DC driving voltages to the first and second external electrical contacts.

10. The light emitting device according to claim 9, wherein the light emitting elements form a plurality of light emitting regions, and the second external electrical contacts are respectively disposed on one of the light emitting regions.

11. The light emitting device according to claim 9, wherein the multi-output linear power driver comprises:
a bridge rectifier circuit, coupled to the light modulator, for transforming the phase-modulated AC power to the DC power; and
a multi-output circuit, coupled to the bridge rectifier circuit, comprising a high-potential output terminal coupled to the first external electrical contact, and a plurality of low-potential output terminals respectively coupled to the second external electrical contacts.

* * * * *